United States Patent [19]

König et al.

[11] Patent Number: 5,096,844
[45] Date of Patent: Mar. 17, 1992

[54] METHOD FOR MANUFACTURING BIPOLAR TRANSISTOR BY SELECTIVE EPITAXIAL GROWTH OF BASE AND EMITTER LAYERS

[75] Inventors: Ulf König, Ulm; Klaus Wörner, Leingarten; Erich Kasper, Pfaffenhofen, all of Fed. Rep. of Germany

[73] Assignees: Licentia Patent-Verwaltungs-GmbH, Frankfurt; Telefunken electonic GmbH, Heilbronn, both of Fed. Rep. of Germany

[21] Appl. No.: 398,368

[22] Filed: Aug. 24, 1989

[30] Foreign Application Priority Data

Aug. 25, 1988 [DE] Fed. Rep. of Germany ....... 3828809

[51] Int. Cl.$^5$ ......................................... H01L 21/331
[52] U.S. Cl. ..................................... 437/33; 437/89; 437/99; 437/188; 437/196; 357/34
[58] Field of Search ............... 148/DIG. 10, 11, 20, 148/25, 26, 50, 96, 122, 152, 33, 33.1, 33.2, 33.3; 156/610–614, 644, 649, 662; 357/34, 35, 43, 49, 54, 55; 437/31, 32, 33, 54, 55, 62, 67, 81, 89, 90, 108, 110, 112, 193, 191, 125, 203, 233, 984, 967

[56] References Cited

U.S. PATENT DOCUMENTS

| | | | |
|---|---|---|---|
| 4,101,350 | 7/1978 | Passley et al. | 437/34 |
| 4,507,853 | 4/1985 | McDavid | 357/71 |
| 4,530,149 | 7/1985 | Jastizelski et al. | 437/90 |
| 4,663,831 | 5/1987 | Birrittella et al. | 437/90 |
| 4,696,097 | 9/1987 | McLaughlin et al. | 437/193 |
| 4,703,554 | 11/1987 | Havemann et al. | 437/31 |
| 4,824,799 | 4/1989 | Komatsu | 437/90 |
| 4,849,371 | 7/1989 | Hansen et al. | 437/90 |
| 4,876,212 | 10/1989 | Koury | 437/34 |
| 4,902,641 | 2/1990 | Koury, Jr. | 437/62 |

FOREIGN PATENT DOCUMENTS

| | | |
|---|---|---|
| 0125943 | 11/1984 | European Pat. Off. . |
| 0189136 | 7/1986 | European Pat. Off. . |
| 3545238A1 | 6/1987 | Fed. Rep. of Germany . |
| 0075877 | 7/1978 | Japan .................... 437/89 |
| 0093252 | 6/1983 | Japan .................... 437/89 |
| 0153350 | 9/1983 | Japan .................... 437/90 |
| 0016340 | 1/1984 | Japan .................... 437/90 |
| 0174366 | 7/1988 | Japan .................... 437/89 |
| 0047070 | 2/1989 | Japan .................... 437/31 |

OTHER PUBLICATIONS

Salsurai et al., "A New Transistor Structure for High Speed Bipolar LSI", Proc. 11th Conf. Solid State Devices, Jpnse, J. Appl. Phys., vol. 19, Sup. 19-1, 1980, pp. 181-185.

F. S. J. Lai, "Dielectrically Isolated CMOS Structure Fabricated by Reverse Trnech Process", IBM Technical DISCLOSURE BULLETIN, vol. 26, No. 6, Nov. 1983.

*Primary Examiner*—Olik Chaudhuri
*Assistant Examiner*—Durmazd Ojan
*Attorney, Agent, or Firm*—Spencer & Frank

[57] ABSTRACT

The invention relates to a method in particular for manufacturing bipolar transistors. By applying selective epitaxy methods and by using self-adjusting techniques, the process sequence is shortened and the transistor properties are improved.

16 Claims, 5 Drawing Sheets

METHOD FOR MANUFACTURING BIPOLAR TRANSISTOR BY SELECTIVE EPITAXIAL GROWTH OF BASE AND EMITTER LAYERS

BACKGROUND OF THE INVENTION

The invention relates to a method for manufacturing semiconductor components in and in particular bipolar transistors by selective epitaxial processes.

The method is used in particular for manufacturing bipolar transistors of Si or III/V semiconductor compounds. Bipolar transistors of this type are integrated in—among others—Si-VLSI (very large scale integration) or multifunctional circuits, e.g. opto-electronic circuits.

With conventional methods of manufacturing bipolar transistors, the components are structured, i.e. the active component layers are produced and/or provided with contacts by implantation and/or diffusion processes generally carried out or cured at high temperatures (approx. 800°–1000°). The lateral dimensions of the individual transistor layers differ, in particular the lateral expanse of the base layer is frequently greater than that of the emitter layer.

SUMMARY OF THE INVENTION

The object underlying the invention is to a method for manufacturing semiconductor components, in particular bipolar transistors, that requires as few different process steps as possible and is usable for different semiconductor materials.

The above object is generally achieved according to the invention by a method of forming a semiconductor component, particularly a bipolar transistor, wherein the active layers of the component have the same lateral dimensions, with the critical layer limits being embedded in insulation layers, and wherein at least the base and emitter layers of the transistor are grown by selective epitaxy process. More particularly, a sequence of layers including at least a first insulating layer, a highly-doped polycrystalline layer of the same conductivity type as the base layer of the transistor, and a further insulating layer are formed on the surface of substrate which may either have a highly-doped buried layer or surface layer of the same conductivity type as the collector of the transistor. A trench is formed through the layer sequence, and then at least the emitter and base layers of the transistor are epitaxially grown in the trench. According to one embodiment of the invention, the collector layer is likewise epitaxially grown in the trench while according to the second embodiment the collector layer is provided as part of the layer sequence initially formed on the surface of the substrate.

According to a preferred feature of the invention, the emitter and base contacts are made by self-adjusting processes.

The method in accordance with the invention has the advantage that the components are structured during and by the epitaxy process used, and not after growing of the semiconductor layers as is the case with conventional methods. The emitter layer and the base layer are manufactured in an epitaxy process. It is an advantage for the emitter layer and the base layer to have the same lateral dimensions, so that parasitic resistances are avoided.

The invention is explained below using embodiments with reference to the drawing figures.

DETAILED DESCRIPTION OF THE PREFERRED EMBODIMENTS

Figure 1A:
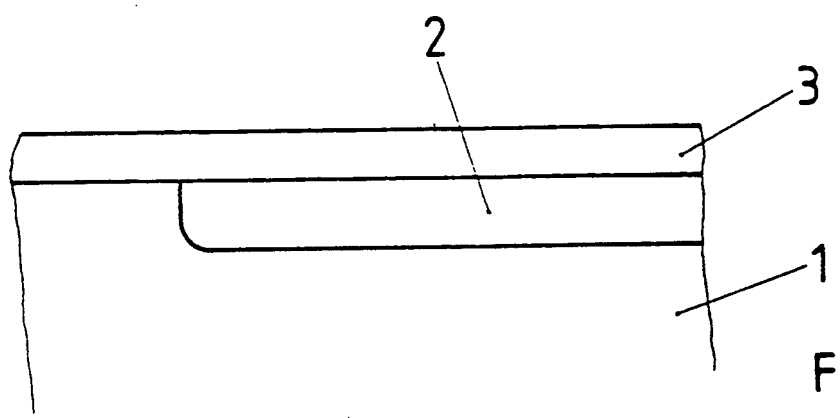
FIGS. 1a–1f illustrate the various process steps according to a first embodiment of the method according to the invention.

In accordance with FIG. 1a, a highly-doped buried semiconductor zone 2 is implanted or diffused into a single-crystal substrate 1 of, for example, Si, GaAs or InP. The doping material is, for example, As with a doping concentration of $5 \cdot 10^{18} - 5 \cdot 10^{20}$ charge carriers per $cm^3$. The doping depth is approx. 1 to 10 $\mu m$. Alternatively, a highly-doped semiconductor layer can be deposited as a contact layer and/or buffer layer onto a substrate 1, which can be high-resistance, for example. The highly-doped semiconductor layer comprises, for example, Si, GaAs or InP and has an As doping concentration of $5 \cdot 10^{18} - 5 \cdot 10^{20}$ $cm^{-3}$.

Figure 1B:
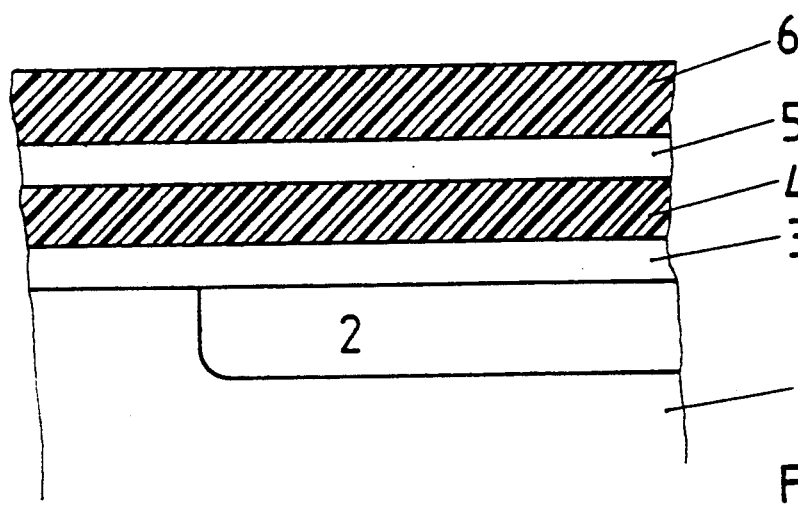
Figure 1C:
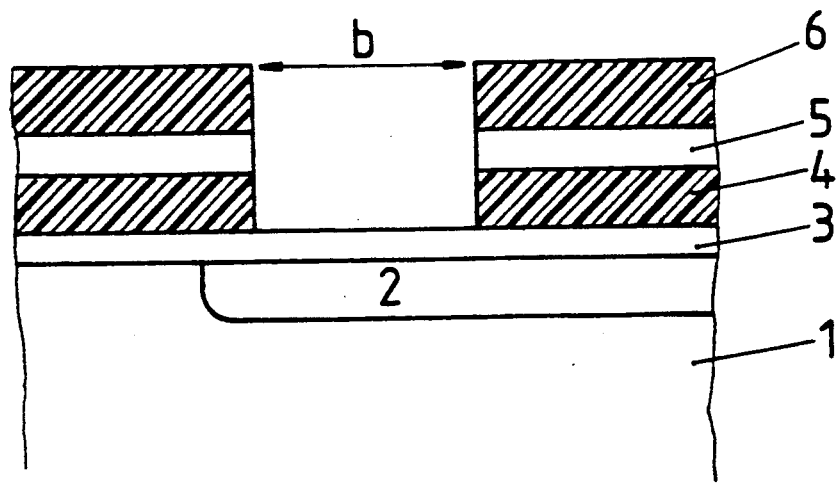
Figure 1D:
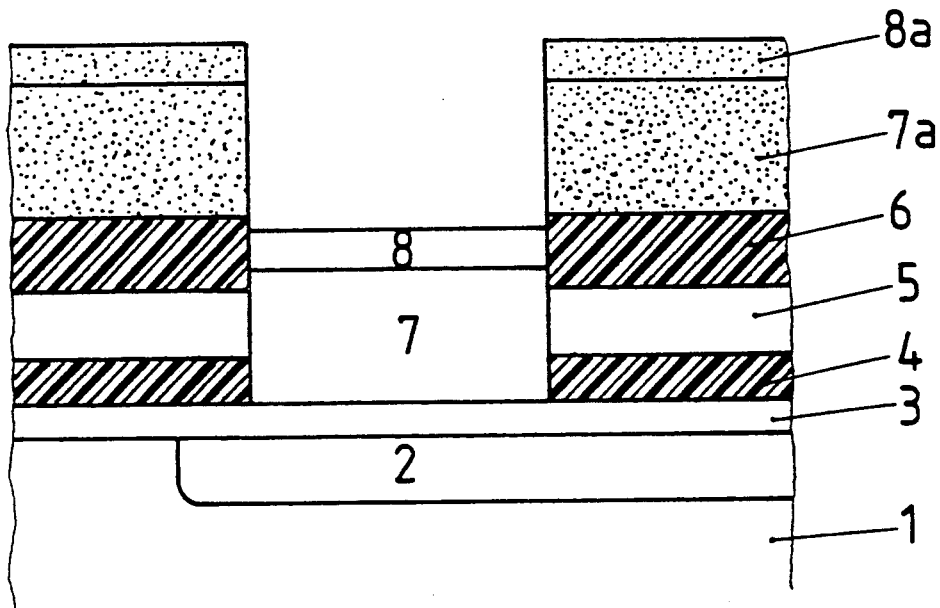
Figure 1E:
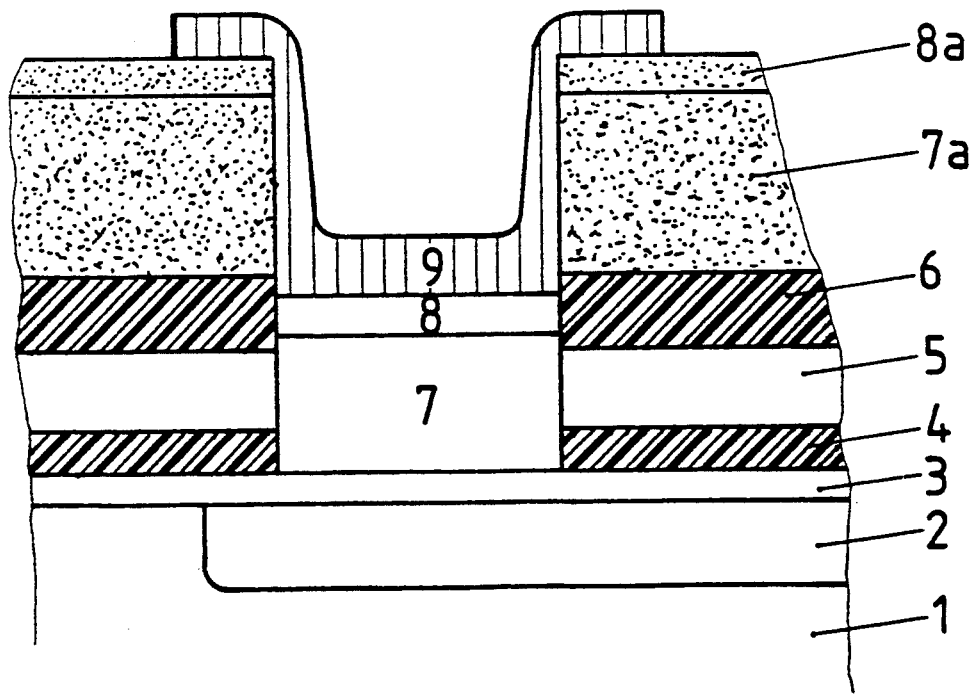
Figure 1F:
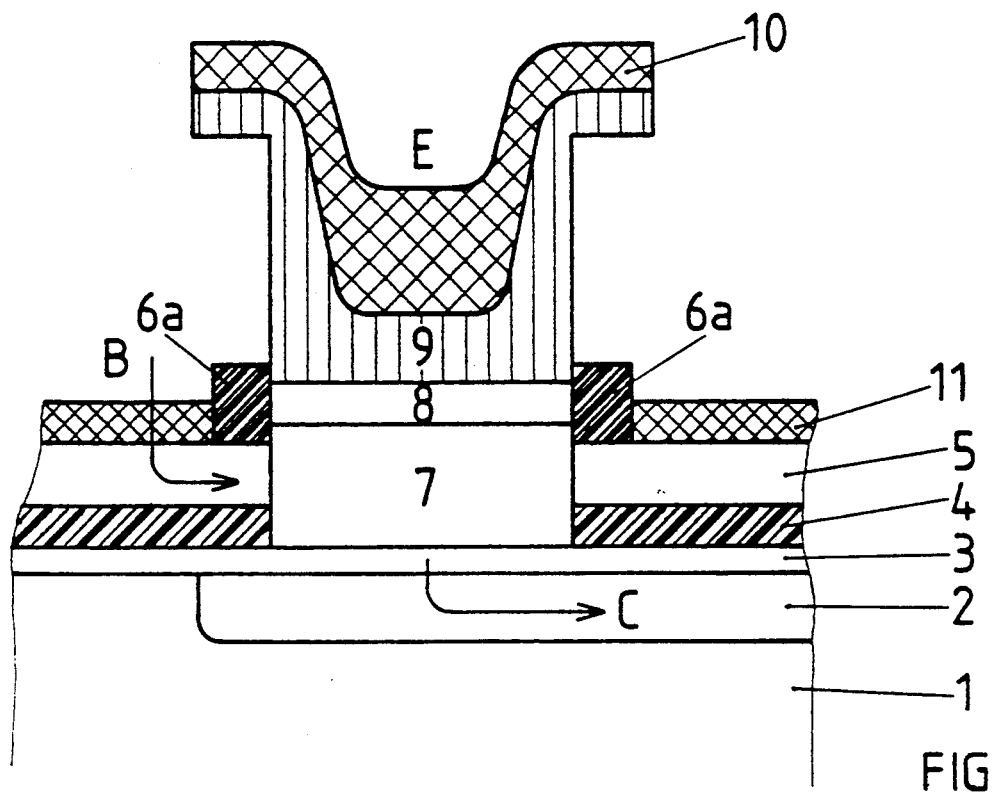

An $n^-$-doped collector layer 3 is epitaxially grown onto this layer. Depending on the selection of the substrate 1, various lattice-matched or lattice-mismatched semiconductor materials are suitable for the collector layer. If an Si-layer, for example, is grown onto an Si substrate or Si contact layer, a lattice-matched collector with high band spacing is formed. If by contrast an SiGe, a GaAs or an InGaAs layer is grown onto an Si substrate or Si contact layer, a lattice-mismatched collector with low band spacing is obtained. With a GaAs substrate or GaAs contact layer and a GaAs collector layer or GaAlAs collector layer, a lattice-matched collector with low or high band spacing respectively is obtained. If an InP substrate or InP contact layer, and an InP or InGaAs collector layer are used, the result is a lattice-matched collector with high or low band spacing respectively. The collector layer 3 is provided with contacts by the semiconductor zone 2. A first insulating layer 4 is grown either thermally or by CVD (chemical vapor deposition) or plasma deposition (FIG. 1b) onto the collector layer 3. The first insulating layer 4 comprises, for example, an oxide and has a layer thickness of approx. 0.05 $\mu m$. In a further epitaxy step, a $p^{++}$-doped, polycrystalline semiconductor layer 5 is grown onto the first insulating layer 4 (FIG. 1b). The semiconductor material for this layer 5 consists, depending on the collector layer 3 selected, of Si, SiGe, GaAs, InGaAs with a charge carrier concentration of $5 \cdot 10^{18} - 5 \cdot 10^{20}$ $cm^{-3}$ and has a layer thickness of approx. 0.1–0.2 $\mu m$. As the doping material for a polycrystalline Si layer, B is preferable, and for a GaAs layer Be, for example. The highly-doped semiconductor layer 5 is used for lateral contacting of the base of the bipolar transistor to be manufactured. A second insulating layer 6 with an analogous composition to that of the first insulating layer 4 is deposited onto the highly-doped semiconductor layer 5 (FIG. 1b). The layer thickness of the second insulating layer 6 must be selected so that the emitter layer to be subsequently grown by epitaxy is embedded in the second insulating layer 6. A trench with a width b of approx. 0.2 to 20 $\mu m$ is then wet- or dry-etched into the layer sequence (FIG. 1c). The collector layer 3 is partially exposed, so that a subsequent selective epitaxy process, e.g. MBE (molecular beam epitaxy) or MOCVD (metal organic chemical vapor deposition) is used to grow the base layer and emitter layer 7, 8 onto the collector layer 3 (FIG. 1d). The base layer 7 consists, depending on the structure of the collector layer 3, of Si, SiGe, GaAs, InGaAs with a positive charge carrier concentration of $10^{17}$–$5\cdot10^{18}$ cm$^{-3}$, and has a layer thickness of approx. 0.2–0.5 μm. The emitter layer 8 comprises, for example, Si, GaAl, As, InP, with a negative charge carrier concentration of $10^{18}$–$10^{20}$ cm$^{-3}$, and has a layer thickness of 0.1–0.4 μm. On the second insulating layer 6 the epitaxy process deposits polycrystalline semiconductor layers 7a, 8a with the same composition as the base layer and emitter layer 7, 8. The layer thickness of the various layers of the bipolar transistor structure must be selected such that the polycrystalline layer 7a is electrically separated by the second insulating layer 6 from the emitter layer 8, and the emitter layer 8 in its turn from the highly-doped polycrystalline semiconductor layer 5. The base layer 7 is thicker than the sum of the layer thicknesses of the first insulating layer 4 and the polycrystalline highly-doped semiconductor layer 5. The emitter layer and base layer 7, 8 are in total thinner than the sum of the thicknesses of the first insulating layer 4, the polycrystalline, highly-doped semiconductor layer 5 and the second insulating layer 6 (FIG. 1d). The surface of the component structure is completely metallized, e.g. with Al or Au or AuGe or AuSb, with a layer thickness of approx. 0.05 to 0.2 μm. Lateral structuring of the contact layer produces the emitter contact 9 (FIG. 1e). The polycrystalline semiconductor layers 7a, 8a are removed by an isotropic etching process. The etching stops at the second insulating layer 6 and at the emitter contact 9. An anisotropic etching process removes the second insulating layer 6 (FIG. 1f). The overhanging emitter contact 9 has the effect of leaving behind an oxide ring 6a that embeds the emitter/base junction. A second complete metallization of the surface of the component structure with, for example, Al or Au or AuZn with a layer thickness of 0.05 to 0.2 μm, results in the base contacts 11 made self-adjusting on the highly-doped polycrystalline semiconductor layer 5 and separated from the emitter layer and base layer 8, 7 by the oxide ring 6a.

Figure 2E:
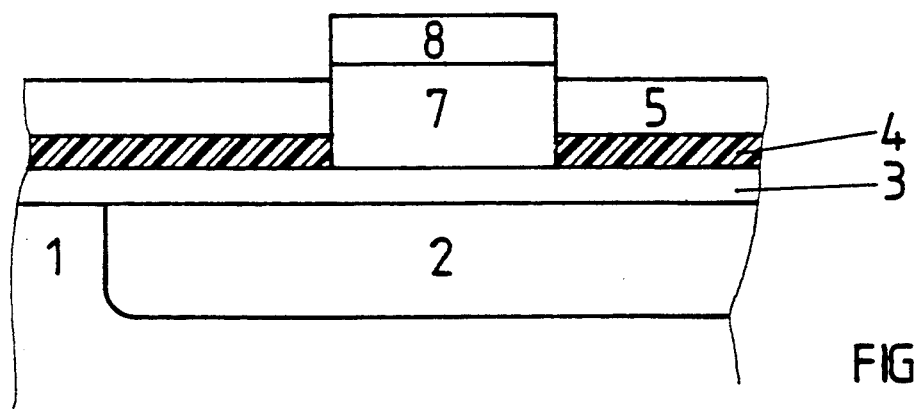
FIGS. 2e–2j illustrate the various process steps according to a modification of the method according to the invention.
Figure 2F:
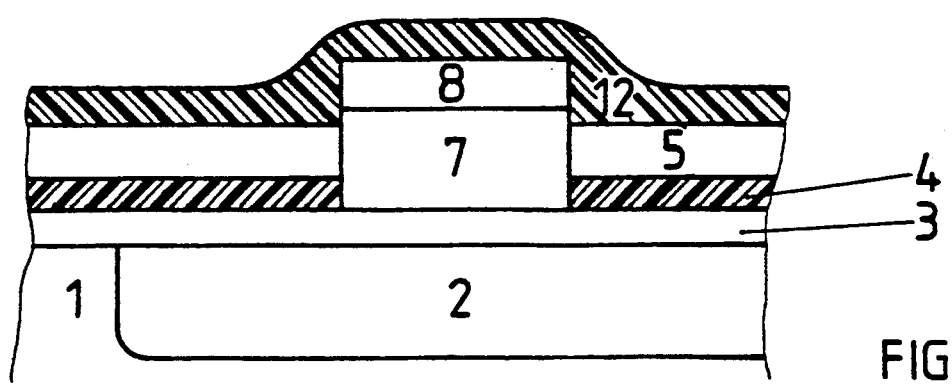
Figure 2G:
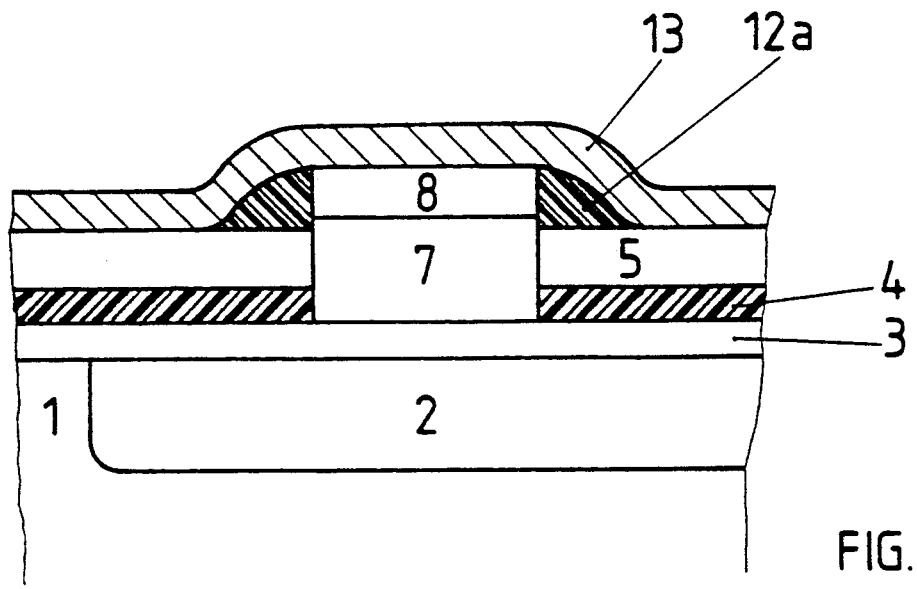
Figure 2H:
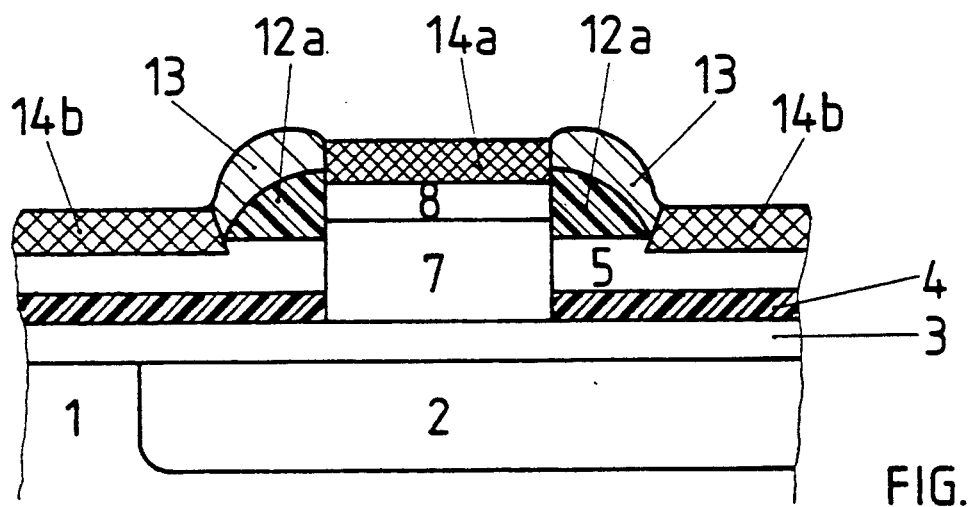

A further advantageous modification of the process steps for manufacture of bipolar transistors is that the polycrystalline semiconductor layers 7a, 8a and the second insulating layer 6 are removed by a so-called stripping process (FIG. 2e) after deposition of the emitter layer and base layer 8, 7 (FIGS. 1a to 1d). The surface of the component structure is coated all over with oxide, preferably flow glass with a layer thickness of 0.1 to 0.5 μm (FIG. 2f). The oxide layer 12 is etched off by reactive ion etching apart from an oxide edge 12a. This so-called "spacer" protects the emitter/base junction in the bipolar transistor. The surface of the component structure is coated with metal (FIG. 2g), preferably under ultra-high vacuum conditions, for example in an MBE facility. If the semiconductor layers 5, 8 are of Si, Ni or Co is preferably used as the material for deposition, while Ge or Zn or Sb is used for III/V semiconductor compounds. In a tempering process at approx. 400° to 700° C., the metal layer 13 combines with the semiconductor layers 5, 8 and creates a eutectic compound. The semiconductor layers 5, 8 are thus made thinner and the contacts 14a, 14b (FIG. 2h) are formed.

Figure 2I:
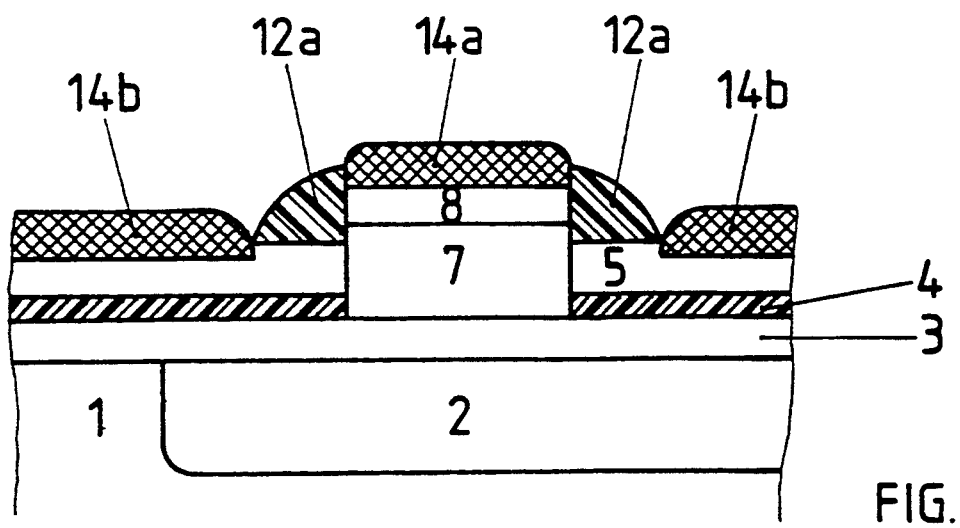
Figure 2J:
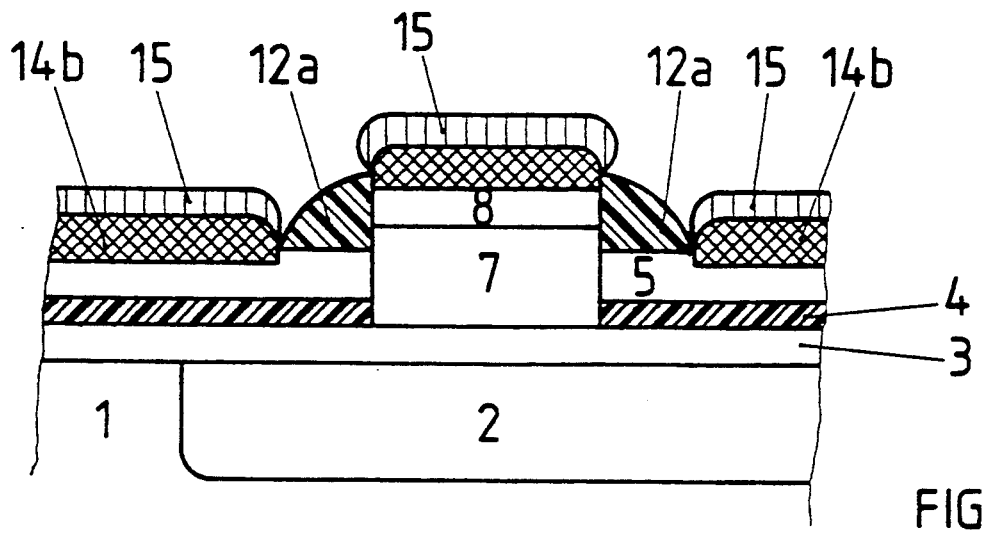

The metal layer 13 remaining on the oxide is then removed by metal-specific etching (FIG. 2i). The contacts 14a, 14b are then again galvanically reinforced, for example with Au. The gold layers 15 are generated (FIG. 2j).

Figure 3A:
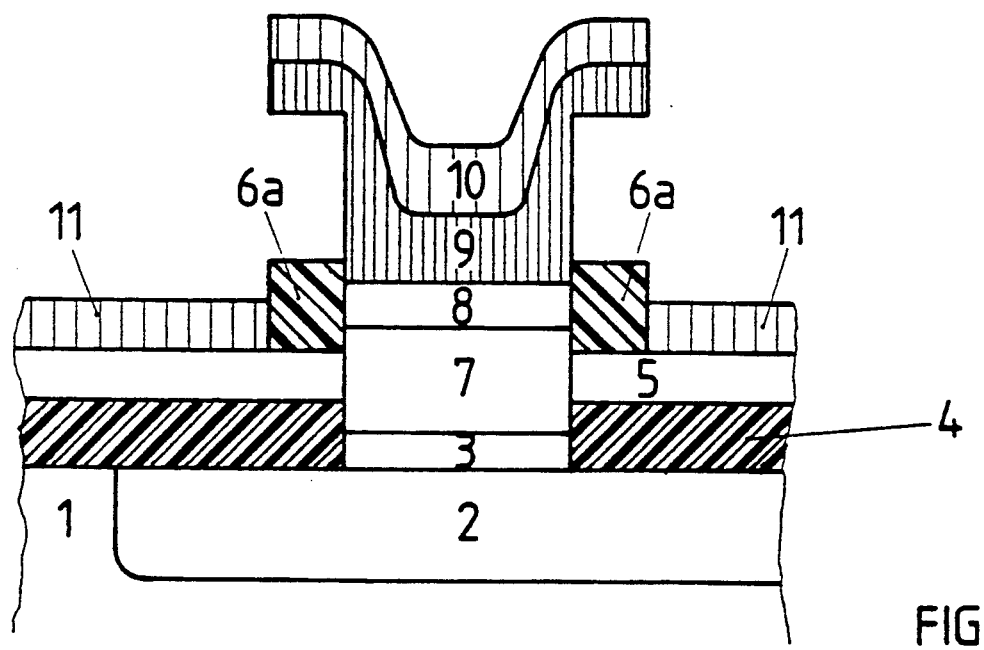
FIGS. 3a and 3b illustrate various process steps according to a further modification of the method according to the invention.
Figure 3B:
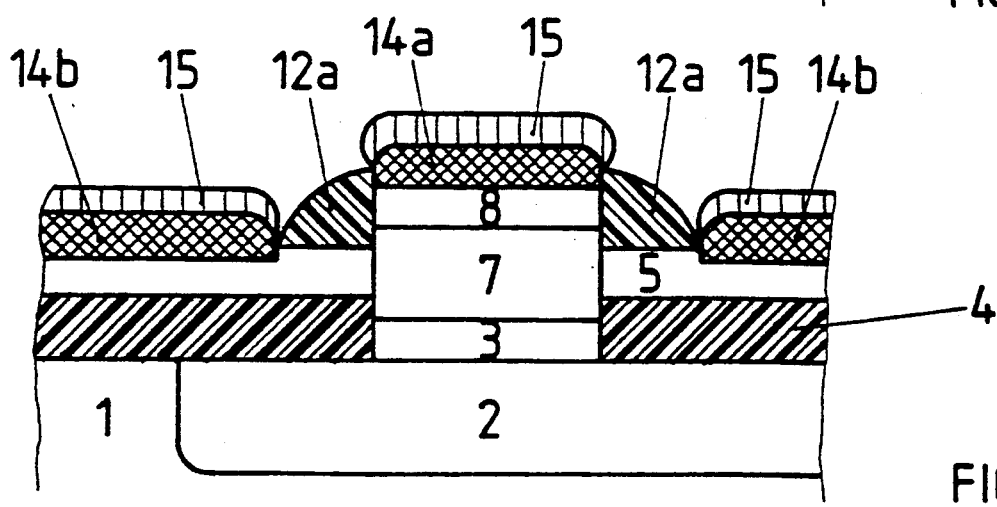

By a further modification of the given manufacturing steps, all transistor layers can be manufactured in an epitaxy process. The first insulating layer 4 is deposited onto the substrate 1 or the contact layer. The layer thickness of the first insulating layer is approx. 0.2 μm. A window is then etched into the insulating layer 4 and the buried semiconductor zone 2 or the contact layer partially exposed. The collector layer, base layer and emitter layer 3, 7, 8 are grown with a selective epitaxy process. The further process steps must be performed as described above. The transistor structures shown in FIGS. 3a, 3b are achieved.

The following bipolar transistors can be manufactured, for example:

a) Emitter, base and collector are made up of Si and form a homostructure.

b) Base and collector are made up of SiGe or GaAs, and the emitter of Si or GaAlAs, and form a heterostructure.

c) Collector and emitter are made up of Si or InP, and the base of SiGe or InGaAs, and form a double heterostructure.

The bipolar transistors can be manufactured both with an npn and a pnp structure. The design of the bipolar transistors is not restricted to the semiconductor materials given in the embodiments. Furthermore, the method in accordance with the invention is not restricted to the manufacture of bipolar transistors, and the semiconductor components used in electronics and opto-electronics can also be manufactured.

We claim:

1. A method of producing a bipolar transistor having active layers grown with the same lateral dimensions comprising the steps of:

providing a substrate having a highly-doped monocrystalline semiconductor region of a first conductivity type at a first surface;

covering the entire said surface with a first layer sequence including at least a first insulating layer, a highly-doped polycrystalline semiconductor layer of a second conductivity type, and a second insulating layer;

etching a trench through said first insulating layer, said polycrystalline semiconductor layer and said second insulating layer;

providing a further layer sequence of a collector layer of said first conductivity type, a base layer of said second conductivity type and an emitter layer of said first conductivity type by epitaxially growing at least said base and emitter layers in said trench by selective epitaxial processes; and, providing emitter and base contacts by: etching away said second insulating layer; depositing an oxide layer on the surface of the substrate to cover said emitter layer and said highly-doped polycrystalline semiconductor layer; etching the oxide layer to remove same except for a portion adjacent the edge of said emitter layer; coating the surface of the substrate with a metal layer to cover the emitter layer, the portion of said oxide layer and the highly-doped polycrystalline semiconductor layer; heating the metal layer to cause the metal to form an eutectic compound with the emitter layer and with the highly-doped polycrystalline semiconductor layer; and then removing the portion of said metal layer over said portion of said oxide layer.

2. A method according to claim 1 wherein said step of providing a substrate includes forming said highly conductive region of a first conductivity type in said surface of said substrate.

3. A method according to claim wherein said step of providing a substrate includes growing said highly conductive semiconductor region of said first conductivity type over the entire surface of a high resistance monocrystalline semiconductor body.

4. A method according to claim 1 wherein: said step of covering includes directly depositing said first layer sequence on said surface of said substrate; said step of etching exposes said highly-doped semiconductor region; said step of providing a further layer sequence further includes epitaxially growing said collector layer in said trench by a selective epitaxial process prior to epitaxially growing said base and said emitter layers.

5. A method according to claim 4 wherein said step of providing a further layer sequence further includes growing said collector layer thinner than said first insulating layer and growing said base layer thicker than said highly-doped polycrystalline semiconductor layer.

6. A method according to claim 1 wherein: said step of covering includes providing a weakly doped semiconductor layer of said first conductivity type between said first insulating layer and said surface ofsaid substrate, whereby a portion of said weakly doped semiconductor layer is exposed after said step of etching and constitutes said collector layer; and said step of providing a further layer sequence includes epitaxially growing said base and emitter layers on layer.

7. A method according to claim 6 wherein said step of providing a further layer sequence further includes: epitaxially growing said base layer thicker than the sum of the thicknesses of said first-insulating layer and of said highly-doped polycrystalline semiconductor layer; and epitaxially growing said emitter layer to a thickness such that the sum of the thicknesses of said base and emitter layers is less than the sum of the thicknesses of said first insulating layer, said highly-doped polycrystalline layer and said second insulating layer.

8. A method of producing a bipolar transistor having active layers grown with the same lateral dimensions comprising the steps of:

providing a substrate having a highly-doped monocrystalline semiconductor region of a first conductivity type at a first surface;

covering the entire said surface with a first layer sequence including at least a first insulating layer, a highly-doped polycrystalline semiconductor layer of a second conductivity type, and a second insulating layer;

etching a trench through said first insulating layer, said polycrystalline semiconductor layer and said second insulating layer;

providing a further layer sequence of a collector layer of said first conductivity type, a base layer of said second conductivity type and an emitter layer of said first conductivity type by epitaxially growing at least said base and emitter layers in said trench by selective epitaxial processes;

growing further polycrystalline semiconductor layers on said second insulating layer during the epitaxial growth of said base and emitter layers while leaving an opening over said emitter layer;

forming a metal emitter contact which contacts said emitter layer within said opening and extends laterally over the surface of said further polycrystalline semiconductor layer surrounding said opening; and, thereafter forming a metal contact for said base layer by etching away said further polycrystalline semiconductor layers and said second insulating layer, except for a portion of said second insulating layer immediately surrounding said emitter layer, to expose the surface of said highly-doped polycrystaline layer, and depositing a metal base contact layer on the exposed surface of said highly-doped polycrystalline layer.

9. A method according to claim 8 wherein said step of providing a substrate includes forming said highly conductive region of a first conductivity type in said surface of said substrate.

10. A method according to claim 8 wherein said step of providing a substrate includes growing said highly conductive semiconductor region of said first conductivity type over the entire surface of a high resistance monocrystalline semiconductor body.

11. A method according to claim 8 wherein: said step of covering includes directly depositing said first layer sequence on said surface of said substrate; said step of etching exposes said highly-doped semiconductor region; said step of providing a further layer sequence further includes epitaxially growing said collector layer in said trench by a selective epitaxial process prior to epitaxially growing said base and said emitter layers.

12. A method according to claim 11 wherein said step of providing a further layer sequence further includes growing said collector layer thinner than said first insulating layer and growing said base layer thicker than said highly-doped polycrystalline semiconductor layer.

13. A method according to claim 8 wherein: said step of covering includes providing a weakly doped semiconductor layer of said first conductivity type between said first insulating layer and said surface of said substrate, whereby a portion of said weakly doped semiconductor layer is exposed after said step of etching and constitutes said collector layer; and said step of providing a further layer sequence includes epitaxially growing said base and emitter layers on the exposed portion of said weakly doped semiconductor layer.

14. A method according to claim 13 whererin said step pf providing a further layer sequence further includes: epitaxially growing said base layer thicker than the sum of the thicknesses of said first insulating layer and of said highly-doped polycrystalline semiconductor layer; and epitaxially growing said emitter layer to a thickness such that the sum of the thicknesses of said base and emitter layers is less than the sum of the thicknesses of said first insulating layer, said highly-doped polycrystalline layer and said second insulating layer.

15. A method for manufacturing a bipolar transistor having active emitter, base and collector layers with at least the base and the emitter layrs being grown with the same lateral dimensions in a selective epitaxy process, said method comprising the steps of:

depositing a layer sequence comprising a weakly doped collector layer of a first conductivity type, a first insulating layer, a highly-doped polycrystalline semiconductor layer of a second conductivity type, and a second insulating layer onto one of (a) the entire surface of a substrate having a highly doped semiconductor zone of said first conductivity type extending to said surface of said substrate, and (b) the entire surface of a highly-doped semiconductor layer of said first conductivity type grown on a high resistance substrate;

etching a trench into the layer sequence such that said collector layer is partially exposed;

growing a base layer of said second conductivity type and an emitter layer of said first conductivity type in the trench onto said collector layer by a selective epitaxy process so that said base layer is grown thicker than the sum of the thicknesses of said first insulating layer and of said highly-doped polycrystalline semiconductor layer, and said base layer and said emitter layer are grown overall thinner than the sum of the thicknesses of said first insulating layer, said highly-doped semiconductor layer and said second insulating layer;

growing further polycrystalline semiconductor layers on said second insulating layer during the epitaxial growth of said base and emitter layers while leaving an opening over said emitter layer;

forming a metal emitter contact which contacts said emitter layer within said opening and extends laterally over the surface of said further polycrystalline semiconductor layer surrounding said opening; and, thereafter forming a metal contact for said base layer by etching away said further polycrystalline semiconductor layers and said second insulating layer, except for a portion of said second insulating layer immediately surrounding said emitter layer, to expose the surface of said highly-doped polycrystalline layer, and depositing a metal base contact layer on the exposed surface of said highly-doped polycrystalline layer.

16. A method for manufacturing a bipolar transistor having active emitter, base and collector layers with at least the base and the emitter layers being grown with the same lateral dimensions in a selective epitaxy process, said method comprising the steps of:

depositing a layer sequence comprising a weakly doped collector layer of a first conductivity type, a first insulating layer, a highly-doped polycrystalline semiconductor layer of a second conductivity type, and a second insulating layer onto one of (a) the entire surface of a substrate having a highly doped semiconductor zone of said first conductivity type extending to said surface of said substrate, and (b) the entire surface of a highly-doped semiconductor layer of said first conductivity type grown on a high resistance substrate;

etching a trench into the layer sequence such that said collector layer is partially exposed;

growing a base layer of said second conductivity type and an emitter layer of said first conductivity type in the trench onto said collector layer by a selective epitaxy process so that said base layer is grown thicker than the sum of the thicknesses of said first insulating layer and of said highly-doped polycrystalline semiconductor layer, and said base layer and said emitter layer are grown overall thinner than the sum of the thicknesses of said first insulating layer, said highly-doped semiconductor layer and said second insulating layer; and, providing emitter and base contacts by; etching away said second insulating layer; depositing an oxide layer on the surface of the substrate to cover said emitter layr and said highly-doped polycrystalline semiconductor layer; etching the oxide layer to remove same except for a portion adjacent the edge of said emitter layer; coating the surface of the substrate with a metal layer to cover the emitter. layer, the portion of said oxide layer and the highly-doped polycrystalline semiconductor layer; heating the metal layer to cause the metal to form a eutectic compound with the emitter layer and with the highly-doped polycrystalline semiconductor layer; and then removing the portion of said metal layer over said portion of said oxide layer.

* * * * *